United States Patent
Jiang

(10) Patent No.: US 10,816,847 B2
(45) Date of Patent: Oct. 27, 2020

(54) DISPLAY PANEL, METHOD OF PRODUCING THE SAME, AND DISPLAY APPARATUS COMPRISING THE SAME

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventor: Liangliang Jiang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 277 days.

(21) Appl. No.: 15/736,769

(22) PCT Filed: May 22, 2017

(86) PCT No.: PCT/CN2017/085306
§ 371 (c)(1),
(2) Date: Dec. 14, 2017

(87) PCT Pub. No.: WO2017/202265
PCT Pub. Date: Nov. 30, 2017

(65) Prior Publication Data
US 2018/0188600 A1    Jul. 5, 2018

(30) Foreign Application Priority Data
May 24, 2016 (CN) .......................... 2016 1 0350223

(51) Int. Cl.
*G02F 1/1335*    (2006.01)
*G03F 7/00*    (2006.01)
(Continued)

(52) U.S. Cl.
CPC ......... *G02F 1/133528* (2013.01); *G02B 1/08* (2013.01); *G02F 1/133514* (2013.01);
(Continued)

(58) Field of Classification Search
CPC ................. G02B 1/08; G02F 1/133528; G02F 1/133512; G02F 1/133514;
(Continued)

(56) References Cited

U.S. PATENT DOCUMENTS 4,187,205 A * 2/1980 Hatano ................... C08K 5/005
523/461
4,786,579 A * 11/1988 Tazawa ............... C08F 299/028
430/280.1
(Continued)

FOREIGN PATENT DOCUMENTS

CN    101051143 A    10/2007
CN    101075047 A    11/2007
(Continued)

OTHER PUBLICATIONS

Box V of Written Opinion of International Searching Authority, for PCT Patent Application No. PCT/CN2017/085306, dated Aug. 21, 2017, 2 pages.

*Primary Examiner* — Sophie Hon
(74) *Attorney, Agent, or Firm* — Kinney & Lange, P.A.

(57) ABSTRACT

There is disclosed a display panel, a method of producing the same, and a display apparatus including the same. This display panel may comprise: a first polarizer; a first substrate, which is disposed above the first polarizer and includes a film layer having polarity as a black matrix, wherein the film layer having polarity has a light absorption axis, the direction of which is perpendicular to the light absorption axis direction of the first polarizer; a liquid crystal layer above the first substrate; a second substrate
(Continued)

above the liquid crystal layer; and a second polarizer, which is disposed above the second substrate and has a light absorption axis, the direction of which is perpendicular to the light absorption axis direction of the first polarizer.

11 Claims, 4 Drawing Sheets

(51) Int. Cl.
    *G03F 7/105* (2006.01)
    *G02B 1/08* (2006.01)
    *G03F 7/004* (2006.01)
    *G03F 7/16* (2006.01)
    *G03F 7/20* (2006.01)
    *G02F 1/1362* (2006.01)

(52) U.S. Cl.
    CPC .......... *G03F 7/0007* (2013.01); *G03F 7/0045* (2013.01); *G03F 7/105* (2013.01); *G03F 7/16* (2013.01); *G03F 7/20* (2013.01); *G02F 1/133512* (2013.01); *G02F 1/136209* (2013.01); *G02F 2001/133531* (2013.01); *G02F 2001/133538* (2013.01); *G02F 2001/133565* (2013.01); *G02F 2203/68* (2013.01); *Y10T 428/1041* (2015.01)

(58) Field of Classification Search
    CPC ... G02F 1/136209; G02F 2001/133565; G03F 7/0007; Y10T 428/1041
    See application file for complete search history.

(56) References Cited

U.S. PATENT DOCUMENTS

| | | | | |
|---|---|---|---|---|
| 6,063,174 | A | * | 5/2000 | Shirota ................ C09D 11/328 106/31.27 |
| 2004/0169795 | A1 | | 9/2004 | Yeh et al. |
| 2007/0082145 | A1 | | 4/2007 | Han et al. |
| 2007/0229733 | A1 | * | 10/2007 | Suh ....................... G02F 1/1339 349/96 |
| 2018/0246368 | A1 | * | 8/2018 | Yu .......................... C09J 131/08 |

FOREIGN PATENT DOCUMENTS

| | | | | |
|---|---|---|---|---|
| CN | 104678642 | A | | 6/2015 |
| CN | 105807479 | A | | 7/2016 |
| JP | 61091655 | A | * | 5/1986 ............... G03F 7/16 |

* cited by examiner

US 10,816,847 B2

DISPLAY PANEL, METHOD OF PRODUCING THE SAME, AND DISPLAY APPARATUS COMPRISING THE SAME

CROSS-REFERENCE TO RELATED APPLICATION

This disclosure claims the priority of Chinese Patent Application No. 201610350223.X filed on May 24, 2016, the entire contents of which are incorporated herein by reference.

TECHNICAL FIELD

This disclosure relates to the technical field of liquid crystal display, and in particular to a display panel, a method of producing the same, and a display apparatus comprising the same.

BACKGROUND ART

At present, black matrices (BM) are used in liquid crystal display panels to separate sub-pixels of various colors, and act to prevent color mixing and inhibit light leakage of pixels. Materials of black matrices used in conventional liquid crystal display panels are typically organic resins added with black chromium ions $Cr^{3+}$ so as to have the function of black state. Although $Cr^{3+}$ has a strong light-absorbing capability, it is strongly toxic and carcinogenic. Thus, they are extremely environment-unfriendly materials.

SUMMARY

An embodiment of this disclosure provides a display panel, comprising:
a first polarizer;
a first substrate, which is disposed above the first polarizer and comprises a film layer having polarity as a black matrix, wherein the film layer having polarity has a light absorption axis, the direction of which is perpendicular to the light absorption axis direction of the first polarizer;
a liquid crystal layer above the first substrate;
a second substrate above the liquid crystal layer; and
a second polarizer, which is disposed above the second substrate and has a light absorption axis, the direction of which is perpendicular to the light absorption axis direction of the first polarizer.

In a possible embodiment, the first substrate is an array substrate, and the second substrate is a color filter substrate.

In a further possible embodiment, a side of the first substrate facing the first polarizer is a display side; or a side of the second substrate facing the second polarizer is a display side.

In a further possible embodiment, the material of the film layer having polarity is a photoresist containing a material having polarity.

In a still further possible embodiment, the material of the film layer having polarity is a mixture of a dichroic dye, 2-hydroxy-2-methyl-1-phenylacetone, acetone, hydroquinone, and a photoresist.

In a still further possible embodiment, the dichroic dye comprises 2%-4% by mass, the 2-hydroxy-2-methyl-1-phenylacetone comprises 1%-3% by mass, the acetone comprises 2%-10% by mass, and the hydroquinone comprises 2%-5% by mass, with respect to the total mass of the mixture.

In a possible embodiment, the film layer having polarity is provided on a side of the array substrate departing from the first polarizer.

In a possible embodiment, the film layer having polarity is a film layer provided between any two film layers in the array substrate.

In a further possible embodiment, the film layer having polarity is a film layer provided between a source/drain electrode and a pixel electrode in the array substrate.

An embodiment of this disclosure further provides a method of producing the display panel described above, comprising a step of producing, in the first substrate, the film layer having polarity.

In a possible embodiment, the step of producing, in the first substrate, the film layer having polarity comprises:
forming a photoresist containing a material having polarity on any film layer of the first substrate, exposing and developing the photoresist containing the material having polarity by a one-time patterning process, and then forming a pattern of the film layer having polarity.

In a further possible embodiment, the photoresist containing a material having polarity is a mixture of a dichroic dye, 2-hydroxy-2-methyl-1-phenylacetone, acetone, hydroquinone, and a photoresist.

In a still further possible embodiment, the dichroic dye comprises 2%-4% by mass, the 2-hydroxy-2-methyl-1-phenylacetone comprises 1%-3% by mass, the acetone comprises 2%-10% by mass, and the hydroquinone comprises 2%-5% by mass, with respect to the total mass of the mixture.

An embodiment of this disclosure further provides a display apparatus, comprising the display panel described above.

DESCRIPTION OF EMBODIMENTS

An embodiment of this disclosure provides a display panel, which may solve problems in the related art caused by the use of toxic chromium ions in black matrices, such as environmental pollution, carcinogenesis, and the like. An embodiment of this disclosure further provides a method of producing this display panel and a display apparatus comprising this display panel.

Figure 1:
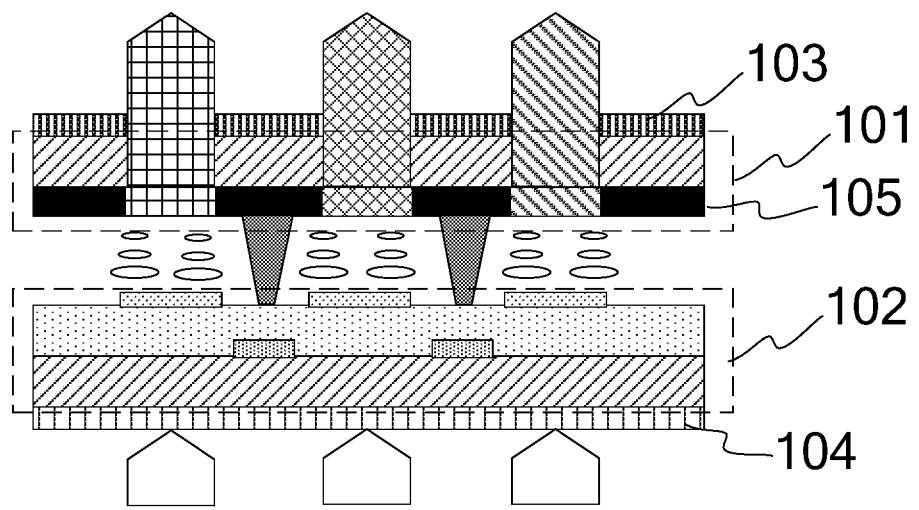
FIG. 1 is a schematic diagram of the sectional structure of a display panel in the related art.

First, as shown in FIG. 1, a thin film transistor-liquid crystal display (TFT-LCD) typically comprises a color filter (CF) substrate 101 and an array substrate 102, a liquid crystal (LC) layer filled between them, and polarizer layers directed perpendicularly with respect to each other (103 and 104 in FIG. 1) on upper and lower substrate surfaces. After an external voltage signal is applied to the array substrate 102, the deflection liquid crystal molecules in a display area is controlled; and the adjustment of transmitted light is achieved by the birefringence effect of liquid crystal molecules. Once circularly polarized light of back light passes through the polarizer at the side of the array substrate 102, linearly polarized light is formed. The linearly polarized light passes through the liquid crystal layer and is converted to elliptically polarized light. Once the elliptically polarized light passes through the polarizer at the side of the color filter substrate 101, linearly polarized light is formed and emitted. The array substrate 102 and the color filter substrate 101 are aligned under a vacuum condition to form a panel. Black matrices 105 on the color filter substrate 101 may act to separate sub-pixels of various colors (such as R, G, and B), prevent color mixing, and inhibit light leakage of pixels. Materials of black matrices used in conventional liquid crystal display panels are typically organic resins added with black chromium ions $Cr^{3+}$ so as to have the function of black state. Although $Cr^{3+}$ has a strong light-absorbing capability, it is strongly toxic and carcinogenic. Thus, they are extremely environment-unfriendly materials.

Figure 4:
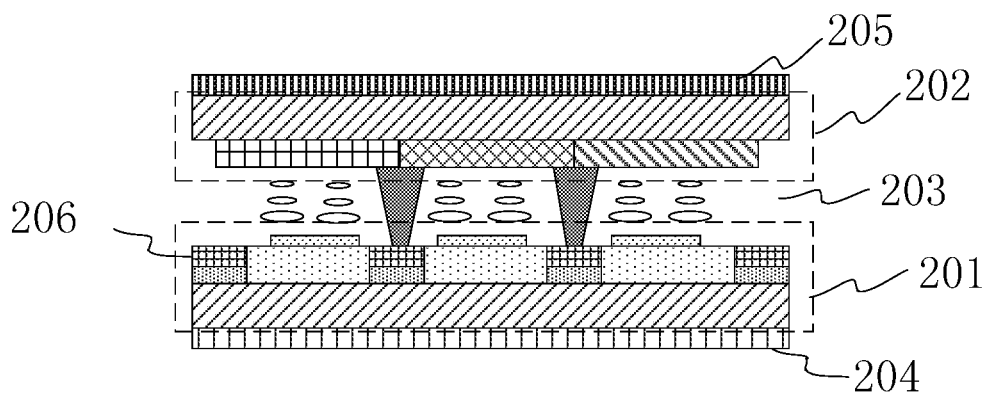
FIG. 4 is a schematic diagram of the sectional structure of a display panel provided in an embodiment of this disclosure.

Referring now to FIG. 4, an embodiment of this disclosure provides a display panel, comprising:

a first polarizer 204;

a first substrate 201, which is disposed above the first polarizer 204 and comprises a film layer 206 having polarity as a black matrix, wherein the film layer 206 having polarity has a light absorption axis, the direction of which is perpendicular to the light absorption axis direction of the first polarizer 204;

a liquid crystal layer 203 above the first substrate;

a second substrate 202 above the liquid crystal layer 203; and a second polarizer 205, which is disposed above the second substrate 202 and has a light absorption axis, the direction of which is perpendicular to the light absorption axis direction of the first polarizer 204.

That is, the display panel in an embodiment of this disclosure comprises: a first substrate 201 and a second substrate 202, which are oppositely provided, a liquid crystal layer 203 located between the first substrate 201 and the second substrate 202, a first polarizer 204 located on the side of the first substrate 201 departing from the liquid crystal layer 203, and a second polarizer 205 located on the side of the second substrate 202 departing from the liquid crystal layer 203; wherein the light absorption axis direction of the first polarizer 204 and that of the second polarizer 205 are perpendicular to each other; and further comprises:

a film layer 206 having polarity which is provided the side of the first substrate 201 departing from the first polarizer 204 and used as a black matrix, wherein the light absorption axis direction of the film layer 206 having polarity and that of the first polarizer 204 are perpendicular to each other.

It is to be noted that positions such as "above" mentioned in this disclosure is merely used to illustrate the relative relationship between members. It can be understood that the configuration and the use of this display apparatus will not be affected if "above" in technical solutions described above is replaced by "below", "left", "front", and the like.

The advantageous effects of the display panel described above may include the following. By providing a film layer 206 having polarity perpendicular to the light absorption axis direction of the first polarizer 204 in the display panel provided in an embodiment of this disclosure, light cannot pass through the position where the film layer 206 having polarity is provided, so that black matrices are replaced, and the use of chromium ions, which are carcinogenic and environment-unfriendly, is avoided. In the specific embodiments, the first substrate described above may be an array substrate and the second substrate may be a color filter substrate, or the first substrate described above is a color filter substrate and the second substrate is an array substrate. This is not limited herein.

The pattern of the film layer 206 having polarity described above covers disordered areas of liquid crystal. Since the light absorption axis direction of the film layer 206 having polarity and the light absorption axis direction of the first polarizer 204 are perpendicular to each other, linearly polarized light, which is formed after circularly polarized light emitted from a back light source passes through the first polarizer 204 (or the film layer 206 having polarity), cannot pass through the film layer 206 having polarity (or the first polarizer 204), so that the effect of light shielding is achieved. In a position which is not covered by the pattern of the film layer 206 having polarity, exemplifying a back light source located on the side of the first substrate 201, linearly polarized light is formed after circularly polarized light emitted from the back light source passes through the first polarizer 204, and elliptically polarized light is formed once this linearly polarized light passes through the liquid crystal layer 203 and then passes through the second polarizer 205 to form emergent light, so that display is achieved.

The disordered area of liquid crystal described above means that liquid crystal surrounding pixels exhibits a disordered state under the action of the common electric field of data line signals, gate electrode drive signals, pixel voltage signals, and common voltage signals simultaneously and fails to achieve a normal function of a light valve. Therefore, the position surrounding pixels is typically provided in an area covered by the pattern of the film layer 206 having polarity. Particularly, patterns of a gate electrode and a source/drain electrode are provided in an area covered by the film layer 206 having polarity. All of metal wires, spacer, or the like covered by a black matrix in the related art may be provided in an area where the pattern of the film layer having polarity is located. Verbose words are omitted herein.

The material of the film layer having polarity described above may be a photoresist containing a material having polarity. Particularly, the material of this film layer having polarity may be a mixture of a dichroic dye, 2-hydroxy-2-methyl-1-phenylacetone, acetone, hydroquinone, and a photoresist. Percentages by mass of various components in this mixture are preferably as follows. The dichroic dye accounts for 2%-4% by mass, the 2-hydroxy-2-methyl-1-phenylacetone accounts for 1%-3% by mass, the acetone accounts for 2%-10% by mass, the hydroquinone accounts for 2%-5% by mass, and remaining part is a photoresist organic resin, with respect to the total mass of the mixture. In the specific practice, percentages by mass of various components may also be selected according to practical circumstances of processing. This is not limited herein.

Figure 2:
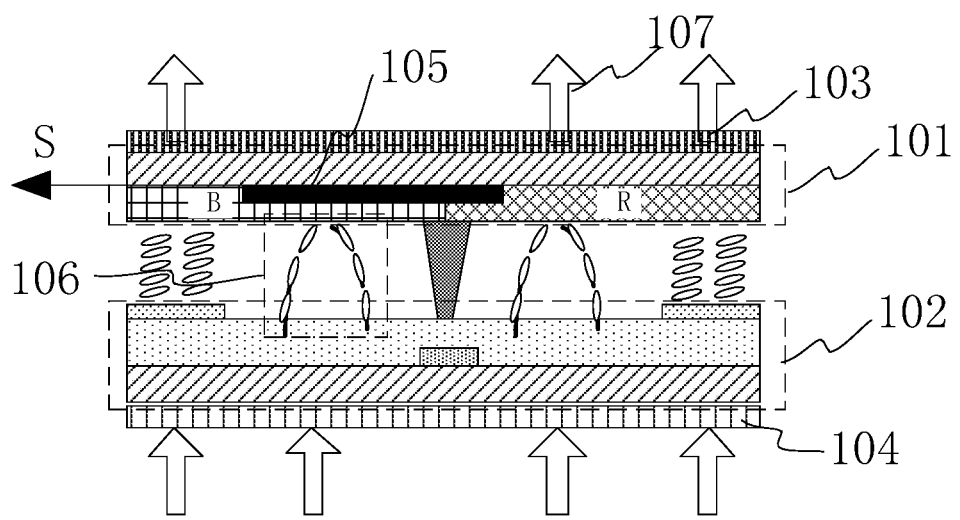
FIG. 2 is a schematic diagram of light leakage of pixels after a substrate of a display panel in the related art shifts.
Figure 3:
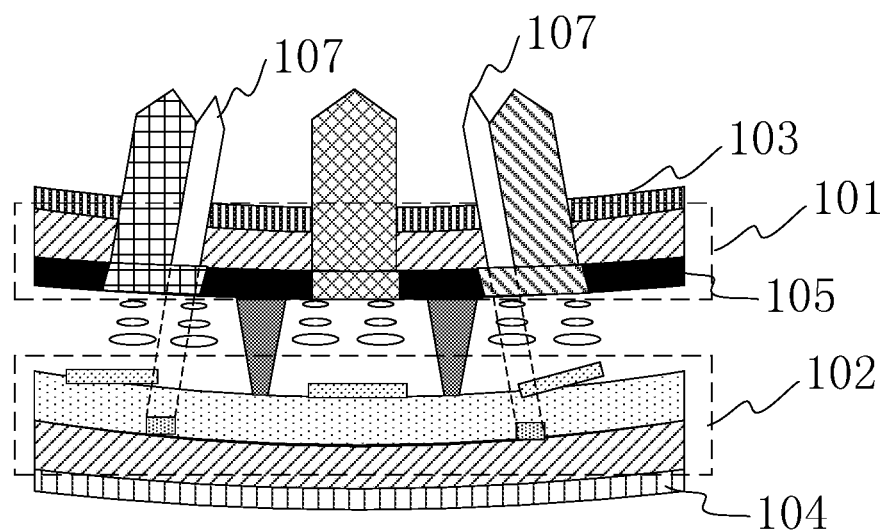
FIG. 3 is a schematic diagram of light leakage of color mixing after a substrate of a display panel in the related art is bent.

In a display panel in the related art, unlike the case that liquid crystal molecules of a normal display area in a pixel is subjected to the action of a pixel voltage and a common voltage, liquid crystal surrounding pixels exhibits a disordered state under the action of the common electric field of data line signals, gate electrode drive signals, pixel voltage signals, and common voltage signals simultaneously and fails to achieve a normal function of a light valve. Typically, when a display panel is subjected to a vigorous external force, such as lateral push-and-pull or bending, to become a curved screen, when severe shift of both sides of the substrate occurs, or when bending treatment is performed to form a curved panel, the black matrix fails to shield the disordered area of liquid crystal and the light leakage area of pixels, and the liquid crystal display panel exhibits highly severe phenomena of light leakage of pixels (as shown in FIG. 2) and light leakage of color mixing (as shown in FIG. 3). The arrow S in FIG. 2 represents the drift direction of a color filter substrate having a blue (B) color filter and a red (R) color filter. As can be seen from the figure, in this case, the black matrix 105 located between the B color filter and the R color filter fails to fully shield the disordered area 106 on the right side in the figure, and light leakage will occur in the liquid crystal display panel, as shown by the arrow 107 in the figure. As also can be seen from FIG. 3, light leakage of color mixing occurs in the liquid crystal display panel.

Severe light leakage and color mixing present in a curved liquid crystal display panel in the related art is fundamentally because the black matrix having the effect of shielding is located on the color filter substrate and fails to be fixed with the light leakage area of liquid crystal on the array substrate, and there is a relatively large space for displacement drift. Particularly, there is certain displacement drift in the process of vacuum alignment of the color filter substrate and the array substrate. When the color filter substrate and the array substrate after being molded are bent by an external force, the relative displacement drift of the color filter substrate and the array substrate are more severe, leading to light leakage and color mixing of the curved liquid crystal display panel.

In a display panel provided in an embodiment of this disclosure, the first substrate described above is preferably an array substrate, and the second substrate described above is preferably a color filter substrate.

The film layer having polarity as a black matrix is provided on the array substrate. The disordered area of pixels and the film layer having polarity having the effect of shielding are provided on the same substrate, so as to alleviate the phenomena of light leakage of pixels and light leakage of color mixing caused when relative displacement or bending occurs between the first substrate and the second substrate.

Figure 5:
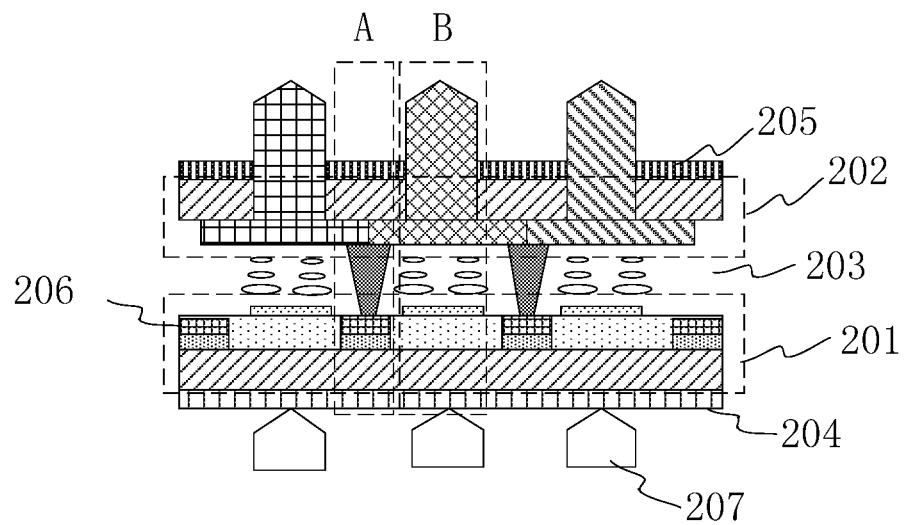
FIG. 5 is a schematic diagram of the sectional structure of a display panel provided in an embodiment of this disclosure.
Figure 6:
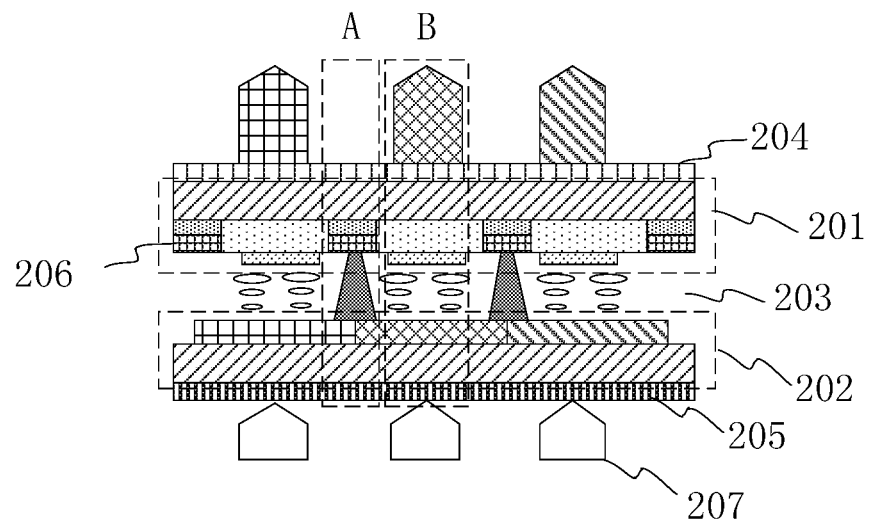
FIG. 6 is a schematic diagram of the sectional structure of a display panel provided in an embodiment of this disclosure.

In an embodiment provided by this disclosure, the side of the first substrate facing the first polarizer is a display side; or the side of the second substrate facing the second polarizer is a display side. As shown in FIG. 5, when the back light source 207 is provided at the side adjacent to the array substrate, circularly polarized light provided by the back light source 207 passes through the first substrate 201, then is subjected to the light adjustment by the liquid crystal layer 203, and passes through the second substrate 202 to form emergent light, so that display is formed on the side of the second substrate 202 facing the second polarizer 205. For the same principle, as shown in FIG. 6, when the back light source 207 is provided at the side adjacent to the second substrate 202, the side of the first substrate 201 facing the first polarizer 204 is a display side.

With reference to FIG. 5 again, once circularly polarized light emitted from the back light source 207 passes through the first polarizer 204, linearly polarized light, which is parallel with the light absorption axis of the first polarizer 204, is formed. In a light inhibited area (A area), the linearly polarized light meets the film layer 206 having polarity, the light absorption axis direction of which is perpendicular and orthogonal thereto, and light cannot be transmitted, so that a black state is formed. The A area covers the above disordered area of liquid crystal, and thus light leakage will not occur. In a light permitted area (B area), once the linearly polarized light passes through the liquid crystal layer 203, elliptically polarized light is formed, and then passes through the second polarizer 205. Emergent light is formed under the action of light valve deflection of the liquid crystal layer 203. The principle of FIG. 6 is similar to that of FIG. 5, and verbose words are omitted herein.

In the specific practice, the film layer having polarity described above may be provided on the side of the array substrate departing from the first polarizer, i.e., the side facing the liquid crystal layer. The film layer having polarity described above may be a film layer provided between any two layers in the array substrate. The film layer having polarity described above is preferably provided between a source/drain electrode and a pixel electrode in the array substrate. By providing a film layer having polarity perpendicular to the light absorption axis direction of the first polarizer, light cannot pass through the position where the pattern of the film layer 206 having polarity is present, so that black matrices are replaced. This is based on property of the polarizer. That is, light passes when light absorption axes are parallel with each other, and light is shielded when they are perpendicular to each other. Therefore, despite of the film layer in the array substrate where the film layer having polarity is located on, the effect of light shielding may be achieved. Therefore, the film layer where the film layer having polarity is located is not limited herein.

Figure 7:
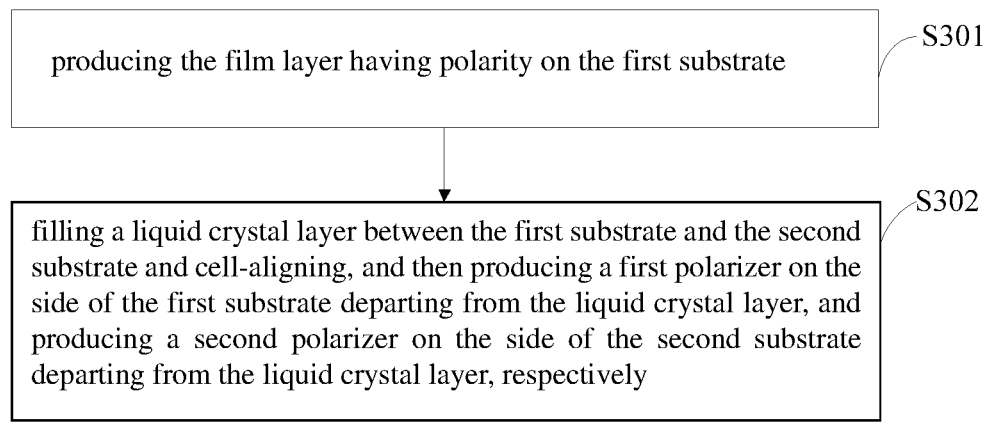
FIG. 7 is a schematic flow chart of a method of producing a display panel provided in an embodiment of this disclosure.

Based on the same inventive concept, an embodiment of this disclosure further provides a method of producing the display panel described above, as shown in FIG. 7, comprising:

S301: producing the film layer having polarity on the first substrate.

This method further comprises a step of producing other members, for example:

S302: filling a liquid crystal layer between the first substrate and the second substrate and cell-aligning, and then producing a first polarizer on the side of the first substrate departing from the liquid crystal layer, and producing a second polarizer on the side of the second substrate departing from the liquid crystal layer, respectively.

The step S301 described above specifically comprises:

forming a photoresist containing a material having polarity on any film layer of the first substrate, exposing and developing the photoresist by a one-time patterning process, and then forming a pattern of the film layer having polarity.

The first substrate as an array substrate and the second substrate as a color filter substrate are exemplified below to specifically illustrate the production method described above.

A common electrode layer, a gate electrode layer, a gate electrode insulating layer, and a source/drain electrode layer are sequentially produced on a base substrate of an array substrate. A photoresist containing a material having polarity is then coated onto the surface of the substrate, and is subjected to processes of mask exposure, development, and the like to obtain a pattern of a film layer having polarity. This pattern covers the disordered area of liquid crystal of the array substrate, and the light absorption axis direction of the film layer having polarity and the light absorption axis direction of the first polarizer attached to the other side of the array substrate are perpendicular to each other. Then, a pixel electrode layer is produced by a photolithographic process.

When the color filter substrate on the opposite side is produced, patterns of three color filters, which are red (R), green (G), and blue (B), are produced on the base substrate, without producing black matrices which separate various sub-pixels in a conventional liquid crystal panel, and thus problems of environmental pollution, carcinogenesis, and the like caused by the use of chromium ions are provided.

The method of producing the display panel described above provided in an embodiment of this disclosure has little effect on process steps of producing a display panel and low cost for modifying process apparatuses, and can utilize existing throughput and apparatuses well.

Based on the same inventive concept, an embodiment of this disclosure provides a display apparatus, comprising the display panel described above. This display apparatus may be any product or member having the function of display, such as a cell phone, a tablet computer, a television, a display, a laptop, a digital photo frame, a navigator, etc. Since this display apparatus has a similar principle for solving problems to that of the display panel described above, the implementation of this display apparatus may be referred to the implementation of the display panel described above. Verbose words are omitted herein.

By providing a film layer having polarity perpendicular to the light absorption axis direction of the first polarizer in the display panel, the method of producing the same, and the display apparatus comprising the same provided in embodiments of this disclosure, light cannot pass through the position where the pattern of the film layer 206 having polarity is present, so that black matrices are replaced, and the use of chromium ions, which are carcinogenic and environment-unfriendly, is avoided. Additionally, the film layer having polarity is provided on the array substrate, and the disordered area of pixels and a third polarizing layer as a black matrix are located on the same substrate. Even if shift of the first substrate and the second substrate occurs or bending is generated by a vigorous external force, defects of light leakage of pixels and color mixing of pixels will not occur.

An embodiment of this disclosure provides a display panel, comprising: a first substrate and a second substrate, which are oppositely provided, a liquid crystal layer located between the first substrate and the second substrate, a first polarizer located on the side of the first substrate departing from the liquid crystal layer, and a second polarizer located on the side of the second substrate departing from the liquid crystal layer; wherein the light absorption axis directions of the first polarizer and the second polarizer are perpendicular to each other; and further comprises:

a film layer having polarity which is provided the side of the first substrate departing from the first polarizer and used as a black matrix, wherein the light absorption axis direction of the film layer having polarity and that of the first polarizer are perpendicular to each other.

In a possible embodiment, in the above display panel provided by an embodiment of this disclosure, the first substrate is an array substrate and the second substrate is an opposite substrate.

In a possible embodiment, in the above display panel provided by an embodiment of this disclosure, the side of the first substrate facing the first polarizer is a display side; or the side of the second substrate facing the second polarizer is a display side.

In a possible embodiment, in the above display panel provided by an embodiment of this disclosure, the material of the film layer having polarity is a photoresist containing a material having polarity.

In a possible embodiment, in the above display panel provided by an embodiment of this disclosure, the material of the film layer having polarity is a mixture of a dichroic dye, 2-hydroxy-2-methyl-1-phenylacetone, acetone, hydroquinone, and a photoresist.

In a possible embodiment, in the above display panel provided by an embodiment of this disclosure, the dichroic dye accounts for 2%-4% by mass, the 2-hydroxy-2-methyl-1-phenylacetone accounts for 1%-3% by mass, the acetone accounts for 2%-10% by mass, and the hydroquinone accounts for 2%-5% by mass, with respect to the total mass of the mixture.

In a possible embodiment, in the above display panel provided by an embodiment of this disclosure, the film layer having polarity is a film layer provided between any two film layers in the array substrate.

In a possible embodiment, in the above display panel provided by an embodiment of this disclosure, the film layer having polarity is a film layer provided between a source/drain electrode and a pixel electrode in the array substrate.

An embodiment of this disclosure further provides a method of producing the display panel described above, comprising:

producing a film layer having polarity on a first substrate;

filling a liquid crystal layer between the first substrate and the second substrate and cell-aligning, and then producing a first polarizer on the side of the first substrate departing from the liquid crystal layer, and producing a second polarizer on the side of the second substrate departing from the liquid crystal layer, respectively.

In a possible embodiment, in the above production method provided by an embodiment of this disclosure, said producing a film layer having polarity on a first substrate specifically comprise:

forming a photoresist containing a material having polarity on any film layer of the first substrate, exposing and developing the photoresist by a one-time patterning process, and then forming a pattern of the film layer having polarity.

An embodiment of this disclosure further provides a display apparatus, comprising the display panel described above.

Obviously, various modifications and variations may be made to this disclosure by the person skilled in the art without deviating from the spirit and the scope of this disclosure. Thus, if these modifications and variations of this disclosure are within the scope of the claims of this disclosure and equivalent techniques thereof, this disclosure also intends to encompass these modifications and variations.

What is claimed is:

1. A display panel, comprising:
   a first polarizer;
   a first substrate, disposed on the first polarizer and comprising a film layer having polarity as a black matrix, wherein the film layer having polarity has a light absorption axis, a direction of which is perpendicular to the light absorption axis direction of the first polarizer;
   a liquid crystal layer on the first substrate;
   a second substrate on the liquid crystal layer; and
   a second polarizer, which is disposed above the second substrate and has a light absorption axis, a direction of which is perpendicular to the light absorption axis direction of the first polarizer,
   wherein the first substrate is an array substrate and the second substrate is a color filter substrate, and the film layer having polarity is provided between a source/drain electrode and a pixel electrode in the array substrate.

2. The display panel as claimed in claim 1, wherein
a side of the first substrate facing the first polarizer is a display side; or
a side of the second substrate facing the second polarizer is a display side.

3. The display panel as claimed in claim 1, wherein the film layer having polarity is formed by exposing and developing a photoresist composition containing a material having polarity by a one-time patterning process.

4. The display panel as claimed in claim 3, wherein the photoresist composition containing a material having polarity is made of a mixture of a dichroic dye, 2-hydroxy-2-methyl-1-phenylacetone, acetone, hydroquinone, and photoresist organic resin.

5. The display panel as claimed in claim 4, wherein the dichroic dye accounts for 2%-4% by mass, the 2-hydroxy-2-methyl-1-phenylacetone accounts for 1%-3% by mass, the acetone accounts for 2%-10% by mass, and the hydroquinone accounts for 2%-5% by mass, with respect to the total mass of the mixture.

6. The display panel as claimed in claim 3, wherein the film layer having polarity is provided on a side of the array substrate departing from the first polarizer.

7. A method of producing the display panel as claimed in claim 1, comprising a step of producing, in the first substrate, the film layer having polarity.

8. The method as claimed in claim 7, wherein the step of producing, in the first substrate, the film layer having polarity comprises:
forming a layer of a photoresist composition containing a material having polarity on the source/drain electrode or the pixel electrode of the first substrate, exposing and developing the photoresist composition containing the material having polarity by a one-time patterning process, and then forming a pattern of the film layer having polarity.

9. The method as claimed in claim 8, wherein the photoresist composition containing the material having polarity is a mixture of a dichroic dye, 2-hydroxy-2-methyl-I-phenylacetone, acetone, hydroquinone, and photoresist organic resin.

10. The method as claimed in claim 9, wherein the dichroic dye accounts for 2%-4% by mass, the 2-hydroxy-2-methyl-1-phenylacetone accounts for 1%-3% by mass, the acetone accounts for 2%-10% by mass, and the hydroquinone accounts for 2%-5% by mass, with respect to the total mass of the mixture.

11. A display apparatus, comprising the display panel as claimed in claim 1.

* * * * *